United States Patent
Vashchenko et al.

(10) Patent No.: US 7,651,897 B2
(45) Date of Patent: Jan. 26, 2010

(54) INTEGRATED CIRCUIT WITH METAL HEAT FLOW PATH COUPLED TO TRANSISTOR AND METHOD FOR MANUFACTURING SUCH CIRCUIT

(75) Inventors: Vladislav Vashchenko, Palo Alto, CA (US); Peter J. Hopper, San Jose, CA (US); Yuri Mirgorodski, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 5 days.

(21) Appl. No.: 11/869,857

(22) Filed: Oct. 10, 2007

(65) Prior Publication Data

US 2008/0032467 A1    Feb. 7, 2008

Related U.S. Application Data

(62) Division of application No. 11/006,346, filed on Dec. 7, 2004.

(51) Int. Cl.
*H01L 21/86* (2006.01)

(52) U.S. Cl. .................. 438/151; 257/E21.704

(58) Field of Classification Search .............. 438/152, 438/597
See application file for complete search history.

(56) References Cited

U.S. PATENT DOCUMENTS

| | | | |
|---|---|---|---|
| 4,929,884 A | 5/1990 | Bird et al. ................ 323/313 |
| 5,864,169 A * | 1/1999 | Shimura et al. ............ 257/587 |
| 6,121,661 A | 9/2000 | Assaderaghi et al. ....... 257/355 |
| 6,190,985 B1 * | 2/2001 | Buynoski .................. 438/311 |
| 6,407,445 B1 | 6/2002 | Vashchenko et al. ....... 257/630 |
| 6,459,142 B1 | 10/2002 | Tihanyi .................... 257/621 |
| 6,483,147 B1 * | 11/2002 | Lin .......................... 257/347 |
| 6,484,117 B1 | 11/2002 | Wohlfarth ................. 702/132 |
| 6,573,565 B2 | 6/2003 | Clevenger et al. .......... 257/355 |
| 6,627,927 B2 | 9/2003 | Wu ........................... 257/213 |
| 6,773,952 B2 | 8/2004 | Armbrust et al. ............ 438/54 |
| 6,777,784 B1 | 8/2004 | Vashchenko et al. ....... 257/587 |
| 6,835,629 B2 | 12/2004 | Fallica ...................... 438/336 |
| 6,953,981 B1 | 10/2005 | Johansson et al. .......... 257/503 |
| 7,160,786 B2 | 1/2007 | Kimura ..................... 438/403 |

* cited by examiner

*Primary Examiner*—Zandra Smith
*Assistant Examiner*—Lawrence Tynes, Jr.
(74) *Attorney, Agent, or Firm*—Girard & Equitz LLP

(57) ABSTRACT

A method for manufacturing a chip with a metal heat flow path extending between a terminal of a transistor thereof and bulk semiconductor material of the chip (e.g., from the terminal to a substrate over which the transistor is formed or to the body of a semiconductor device adjacent to the transistor). The chip can be implemented by a semiconductor on insulator (SOI) process and can include at least one bipolar or MOS transistor, an insulator underlying the transistor, a semiconductor substrate underlying the insulator, and a metal heat flow path extending between a terminal of the transistor through the insulator to the substrate. Preferably, the metal heat flow path is a metal interconnect formed by a process step (or steps) of the same type performed to produce other metal interconnects of the chip.

1 Claim, 7 Drawing Sheets

INTEGRATED CIRCUIT WITH METAL HEAT FLOW PATH COUPLED TO TRANSISTOR AND METHOD FOR MANUFACTURING SUCH CIRCUIT

CROSS-REFERENCE TO RELATED APPLICATION

This application is a divisional of U.S. application Ser. No. 11/006,346, entitled "Integrated Circuit with Metal Heat Flow Path Coupled to Transistor and Method for Manufacturing Such Cicuit," filed Dec. 7, 2004 (pending).

BACKGROUND OF THE INVENTION

1. Field of the Invention

The invention pertains to heat sinks for transistors of integrated circuits. In accordance with some embodiments, an integrated circuit (chip) includes at least one transistor terminal coupled to metal that provides a heat flow path from the transistor to bulk semiconductor material of the chip. The chip can be implemented by an SOI (silicon on insulator) process to include an insulator layer between the transistor and a substrate, the metal can extend through the insulator to the substrate, and the metal can be an interconnect produced by the same process step or steps performed to form other metal interconnects of the chip.

2. Description of the Related Art

The expression "PMOS transistor" herein denotes a P-channel MOSFET device. The expression "NMOS transistor" herein denotes an N-channel MOSFET device.

The term "N-well" herein denotes a well of N-type semiconductor material. The term "P-well" herein denotes a well of P-type semiconductor material.

The expressions "SOI chip" and "SOI integrated circuit" are used interchangeably herein to denote an integrated circuit implemented by a semiconductor on insulator ("SOI") process. One type of SOI process includes the steps of bonding a first layer of silicon to an insulator (e.g., an oxide layer on a silicon substrate) and then performing processing steps to form a circuit in or on the first layer of silicon.

For many integrated circuits, one of the critical issues that significantly limits circuit capabilities is the self-heating effect. For example, in some SOI chips, undesirable self-heating of a transistor can occur under some operating conditions when heat generated in the transistor is not efficiently dissipated in the underlying semiconductor substrate because an electrically (and thermally) insulating layer (e.g., an oxide layer) between the transistor and substrate prevents efficient heat transfer from transistor to substrate. Self-heating can cause a variety of different undesirable effects. For example, transistors implemented in different areas of an SOI chip (e.g., transistors having identical structure) that are intended to operate with identical output current-voltage characteristics may actually have very different output current-voltage characteristics if they operate at significantly different temperatures. For another example, a current mirror implemented (using bipolar transistors) as an element of an SOI chip can generate an output current that that is not proportional to its input (reference) current as intended (i.e., the output current changes nonlinearly in response to changes in the input current) if the transistors operate at different temperatures.

Various integrated circuit structures have been proposed for providing transistor heat sinks. For example, U.S. Pat. No. 6,777,784, issued Aug. 17, 2004, and assigned to the assignee of the present invention, discloses a transistor (of an integrated circuit) having an enlarged metal terminal that can sink more heat from the rest of the transistor than could a smaller (conventionally-sized) terminal. Also, U.S. Pat. No. 6,777,784 and U.S. Pat. No. 6,407,445 (issued Jun. 18, 2002, and assigned to the assignee of the present invention) disclose a metal heat sink coupled to an element of a transistor (e.g., the base region of a bipolar transistor) for sinking heat from the transistor element to which the metal is coupled. However, neither reference suggests coupling the enlarged metal terminal (or separate metal heat sink) to bulk semiconductor material of the chip that includes the transistor.

U.S. Pat. No. 6,573,565, issued Jun. 3, 2003, discloses coupling a diamond-like (e.g., silicon carbide) or diamond structure to a transistor of an SOI chip. Each diamond (or diamond-like) structure provides a heat flow path from the transistor through a buried oxide layer (underlying the transistor) to a semiconductor substrate underlying the buried oxide layer, to allow heat from the transistor to dissipate in the substrate. Each diamond (or diamond-like) structure is said to be highly thermally conductive but electrically insulating. Disadvantageously, formation of such diamond (or diamond-like) structures would complicate the fabrication of conventional SOI chips (that do not include any other diamond or diamond-like structure) by requiring performance of at least one special process step in addition to the conventional processing steps performed to produce the chips' non-diamond (and non-diamond-like) structures.

U.S. Pat. No. 6,121,661, issued Sep. 19, 2000, discloses forming doped polysilicon plugs that extend from a transistor of an SOI chip (e.g., from the transistor's body) through buried oxide (underlying the transistor) to a semiconductor substrate underlying the buried oxide, to allow heat from the transistor to dissipate in the substrate. Each polysilicon plug is doped so as to have polarity opposite to that of the substrate material. Thus, there is a pn-junction at the plug-substrate boundary. Disadvantageously, formation of such heat-dissipating, doped polysilicon plugs would complicate the fabrication of conventional SOI chips (that do not include any other polysilicon structure sufficiently deep to extend from the top surface of their transistors' bodies through a buried oxide layer to an underlying substrate) by requiring performance of at least one special process step (a heat-dissipating, polysilicon plug-forming step) in addition to the conventional processing steps performed to produce the chips' other structures (i.e., the structures other than heat-dissipating polysilicon plugs). The polysilicon ("polygate layer") employed to form the gates of conventional SOI chips conventionally has insufficient thickness to extend from the top of the transistor bodies of such a chip through the buried oxide layer to the underlying substrate. Thus, the processing steps performed to form the polygate layer of such chips could not also form heat-dissipating, doped polysilicon plugs of the type disclosed in U.S. Pat. No. 6,121,661. Rather, at least one additional processing step would be required to form such heat-dissipating, doped polysilicon plugs.

BRIEF DESCRIPTION OF PREFERRED EMBODIMENTS

In a class of embodiments, the invention is an integrated circuit including at least one transistor, with a metal heat flow path extending between a terminal of the transistor and bulk semiconductor material of the chip separate from the transistor (e.g., between the terminal and a substrate over which the transistor is formed, or the terminal and the body of a semiconductor device adjacent to the transistor). In some embodiments in this class, the chip is implemented by an SOI (semiconductor on insulator) process and includes at least one bipolar transistor, an insulator underlying the transistor, and a semiconductor substrate underlying the insulator. A metal heat flow path extends between a terminal of the bipolar transistor (e.g., an emitter terminal) through the insulator to the substrate. In other embodiments in this class, the chip is implemented by an SOI process and includes at least one MOS transistor, an insulator underlying the transistor, and a semiconductor substrate underlying the insulator. A metal heat flow path extends between a terminal of the MOS transistor (e.g., a source or drain terminal) through the insulator to the substrate. In other embodiments, a metal heat flow path extends from a terminal of a transistor to the body of another semiconductor device laterally displaced from the transistor.

In preferred embodiments of the invention, each metal heat flow path is a metal interconnect (between a transistor terminal and bulk semiconductor material of the chip). Other metal interconnects of the chip (e.g., interconnects between transistors of the chip) are formed by an interconnect-forming process which comprises one or more process steps, and the inventive metal interconnect (which provides a heat flow path between the transistor terminal and bulk semiconductor material of the chip) is formed by the same interconnect-forming process.

In other embodiments, at least one metal heat flow path (between a transistor terminal and bulk semiconductor material of the chip) is a thick metal structure (substantially thicker than at least some metal interconnects of the chip) formed by the same process step (or steps) performed to produce other thick metal structures of the chip that do not function as heat flow paths to bulk semiconductor material. Examples of thick metal structures of the latter type include bond metal, and permalloy cores for inductors having high inductance.

In typical embodiments, mask and process etch steps are performed to produce a trench that extends from a top surface of the chip through an insulating layer (underlying a top layer of the chip) into a semiconductor substrate (underlying the insulating layer). Metal for implementing the inventive heat flow path is then introduced to fill the trench completely or partially. For example, mask and process etch steps are performed to produce a trench that extends through the silicon structure of a thin film transistor and box oxide underlying the transistor to a silicon substrate underlying the box oxide, and metal for implementing the heat flow path is then introduced to fill the trench completely or partially.

In a class of embodiments of the inventive integrated circuit, output circuitry of the chip includes power transistors. At least one (and typically all) of the power transistors is implemented in accordance with the invention to include a metal heat flow path between a terminal thereof (e.g., a power device terminal directly connected to ground or to a power supply bus) and bulk semiconductor material of the chip. In typical embodiments in this class, the integrated circuit is an SOI chip that also includes low-power circuitry (circuitry, distinct from the output circuitry, that operates with lower voltage across its transistors than the voltage applied across power transistors of the output circuitry). No transistor of the low-power circuitry has a terminal coupled (by a metal heat flow path) to bulk semiconductor material of the chip. The low-power circuitry thus benefits from all the substrate isolation advantages provided by SOI technology while the metal heat flow paths (to a bulk semiconductor heat sink) in the output circuitry provide heat balancing benefits in accordance with the invention.

A metal heat flow path implemented in accordance with the invention can be thermally coupled to the bulk semiconductor heat sink, but electrically isolated from a major portion of the bulk semiconductor heat sink. For example, such electrical isolation may be desired when the metal heat flow path is directly coupled to a power supply electrode. The electrical isolation can be achieved in any of a variety of ways. For example, a trench can be formed through a transistor (e.g., through the silicon structure of a thin film transistor and the underlying box oxide) to a semiconductor substrate on which the transistor is formed. Substrate material at the bottom of the trench can then implanted with ions to form an electrically isolating junction (e.g., PN junction), and metal can then be introduced into the trench to provide the metal heat flow path. For example, if the substrate is a P-type semiconductor, an N-well can be produced by ion implantation at the bottom of the trench, and the metal heat flow path can then be formed to extend from the transistor terminal to the N-well. Typically, an implant of a type performed elsewhere in the chip (in accordance with the baseline process) can be used to electrically isolate the inventive heat flow path from the bulk semiconductor heat sink.

The efficiency of heat dissipation in accordance with the invention depends on the actual dimensions of each specific structure that embodies the invention (e.g., the thickness of the metal deposited to form the heat flow path, and length of the metal heat flow path) and the location (within the transistor) of the terminal to which the metal heat flow path is coupled. Depending on the heat flow path's dimensions, simulations indicate that an improvement of up to at least 200% in operating lattice temperature (of the transistor from which heat is dissipated) and an improvement of up to at least 75% in operating voltage of the transistor can be achieved in accordance with typical embodiments of the invention (by providing a metal heat flow path coupled between a terminal of the transistor and the substrate or other bulk semiconductor material of the chip). Such improvements can significantly simplify the design of an integrated circuit and improve its performance. Many integrated circuits can be manufactured with metal heat flow paths in accordance with the invention (and the resulting improvements can thus be obtained) without the need to perform any process step that would not otherwise be performed to form other structures on each such chip if the metal heat flow paths were not formed on the chip.

In a class of embodiments, the invention is an integrated circuit that implements at least one current mirror. Each current mirror includes at least two transistors formed over a semiconductor substrate (or otherwise formed in or over bulk semiconductor material). A metal heat flow path extends between a terminal of a first one of the transistors, and either bulk semiconductor material of a second one of the transistors or a semiconductor substrate underlying both of the transistors. In some such embodiments, the integrated circuit is implemented by an SOI process, an insulator underlies each transistor and overlies a substrate, and each of the transistors (or each of a subset of the transistors) has a metal heat flow path extending from a terminal thereof through the insulator to the substrate. The heat flow path provides (or the heat flow paths provide) a thermal connection between transistors of each current mirror to ensure that the transistors' operating conditions are more similar than they would be if each heat flow path were omitted.

In another class of embodiments, the invention is an integrated circuit including transistors and a feedback control loop coupled to at least one of the transistors and configured to sense the temperature of said one of the transistors and to control at least one operating parameter (e.g., a bias voltage) of said one of the transistors in response to the sensed temperature. Typically, the control loop uses feedback indicative of temperature to implement temperature stabilization. In some embodiments, the feedback control loop includes a band gap temperature sensing circuit coupled to each transistor whose temperature is to be sensed (or to material in thermal contact with such transistor). Typically, no metal heat flow path extends between a terminal of any of the transistors and bulk semiconductor material of the chip. However, in some embodiments in the class, a metal heat flow path does extend between a terminal of at least one of the transistors and bulk semiconductor material of the chip (e.g., between the terminal and a semiconductor substrate over which the transistors are formed).

In another class of embodiments, the invention is an integrated circuit (chip) including at least one transistor having a metal heat flow path extending between a terminal of the transistor and a semiconductor substrate over which the transistor is formed. The metal heat flow path includes metal that fills (completely or partially) a trench extending from a top surface of the chip to the substrate. The chip also includes at least one other semiconductor device (sometimes referred to herein as a "substrate device") formed at the bottom of a second trench extending from the top surface of the chip to the substrate. In some embodiments in this class, the substrate device is a Zener diode (or other simple device). In some embodiments in this class, one or more epi layers (epitaxial layers) are formed on the substrate at the bottom of the trench and the substrate device is (or the substrate devices are) formed in or on the epi layers.

Methods of manufacturing any embodiment of the inventive integrated circuit are also within the scope of the invention.

DETAILED DESCRIPTION OF PREFERRED EMBODIMENTS

Figure 1:
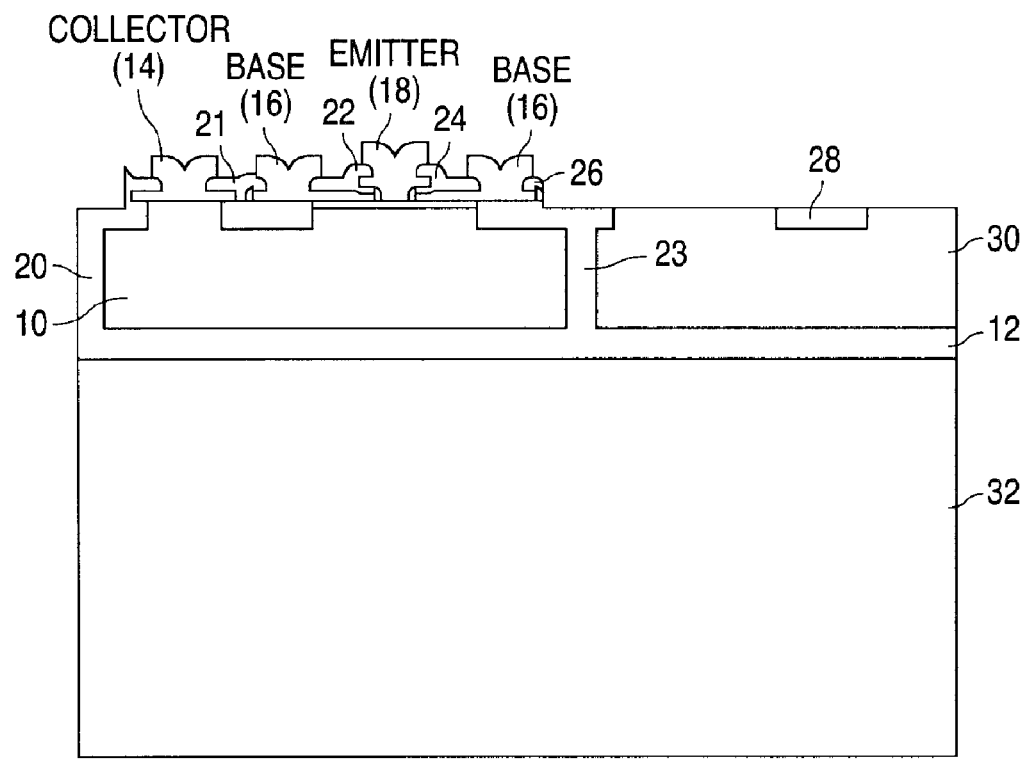
FIG. 1 is a cross-sectional view of a portion of a conventional integrated circuit including an NPN bipolar transistor formed over an oxide layer (12). Semiconductor substrate 32 underlies oxide layer 12.

FIG. 1 is a cross-sectional view of a portion of a conventional SOI integrated circuit. To manufacture the FIG. 1 chip, oxide layer 12 is formed on P-type silicon substrate 32 and a top layer of silicon (including silicon regions 10 and 30) is bonded to oxide layer 12. Additional processing steps (including appropriate doping of regions 10 and 30) are then performed to form a circuit in the top layer of silicon. One NPN bipolar transistor of such circuit comprises collector terminal 14, base terminal 16, and emitter terminal 18. Two portions of base terminal 16 are shown in FIG. 1. Doped region 10 is the body of the NPN bipolar transistor. Each of terminals 14, 16, and 18 is coupled to at least one other element (not shown) of the integrated circuit by a metal interconnect which extends out of the plane of FIG. 1 and has the same thickness (above region 10) as does each of terminals 14, 16, and 18. The NPN transistor also includes oxide regions 20, 21, 22, 23, 24, and 26, which electrically insulate terminals 14, 16, and 18 from each other and from other elements of the circuit.

The FIG. 1 circuit also includes other devices formed over oxide layer 12, none of which is shown in its entirety. Doped silicon region 30 is the body of a device adjacent to the NPN bipolar transistor. Oxide region 28 is formed in region 30.

Oxide layer 12 has poor thermal conductivity. Although silicon substrate 32 has much better thermal conductivity than layer 12, oxide layer 12 thermally isolates the NPN bipolar transistor of FIG. 1 from substrate 32. Thus, the NPN bipolar transistor can become undesirably hot (e.g., significantly hotter than related devices of the chip) during operation.

Figure 2:
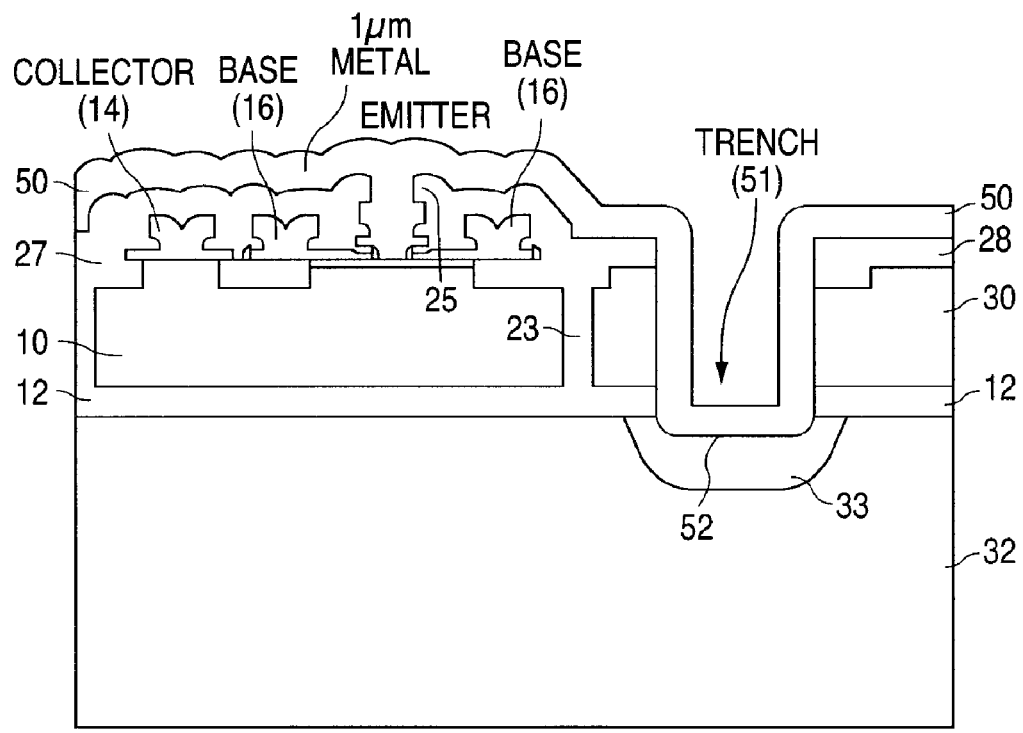
FIG. 2 is a cross-sectional view of a portion of an integrated circuit that embodies the invention and includes an NPN bipolar transistor formed over oxide layer 12, with a relatively thin metal interconnect (50) providing a heat flow path between the transistor's emitter and a semiconductor substrate (32) underlying oxide 12. Trench 51 extends through oxide 12, and a portion of interconnect 50 lines trench 51. A volume (33) of substrate material at the bottom of trench 51 is doped to have polarity opposite to that of substrate 32, so that a PN junction between volume 33 and substrate 32 electrically isolates interconnect 50 from a major portion of substrate 32, but does not thermally isolates interconnect 50 from substrate 32.

FIG. 2 is a cross-sectional view of a portion of an integrated circuit that embodies the invention and differs from the FIG. 1 chip only in that it includes metal interconnect 50 (which provides a heat flow path between substrate 32 and the NPN bipolar transistor's emitter), trench 51 and doped region 33 (to be described below), and oxide regions 25 and 27 (in place of oxide regions 20, 21, 22, 24, and 26). The elements of FIG. 2 that are identical to corresponding elements of FIG. 1 are numbered identically in these two figures and the description thereof will not be repeated with reference to FIG. 2.

To manufacture the FIG. 2 chip, mask and process etch steps are performed to extend trench 51 through region 30 and oxide layer 12 into the underlying substrate 32. A volume of substrate material at the bottom of trench 51 is doped to produce N-type silicon region 33. Thus, a PN junction between region 33 and substrate 32 is available to isolate interconnect 50 electrically from a major portion of substrate 32.

The NPN transistor comprising collector terminal 14 and base terminal 16 is then formed in and on region 10, and other circuitry is formed in and on region 30 and other semiconductor regions laterally displaced from regions 10 and 30. Metal interconnects, including metal interconnects that extend out of the plane of FIG. 2 to couple each of terminals 14 and 16 to at least one other element of the chip, are formed by an interconnect-forming process (which comprises one or more process steps). Each of the interconnects has the same thickness (above region 10) as does each of terminals 14 and 16.

Oxide regions 25 and 27 are then formed over the interconnects (and other exposed structures) to electrically isolate terminals 14 and 16 and the emitter terminal of the NPN transistor from each other and from other circuit elements. Another metal interconnect deposition operation of the same type as (and preferably identical to) the interconnect-forming process performed earlier to produce other metal interconnects of the chip is then performed to deposit the metal comprising interconnect 50 over the NPN transistor's emitter and oxide regions 25 and 27, and to partially fill trench 51 with metal. Metal interconnect 50 is typically shaped to couple the NPN transistor's emitter terminal electrically to at least one other element of the chip as well as to couple the emitter terminal thermally to substrate 32. In typical implementations, the thickness of metal interconnect 50 (and of each metal interconnect that couples terminal 14 or 16 to another element of the chip) is about 1 micron.

In the FIG. 2 circuit, metal interconnect 50 provides a heat flow path between the NPN transistor's emitter and substrate 32. The PN junction between volume 33 and substrate 32 (below bottom surface 52 of trench 51) electrically isolates interconnect 50 from a major portion of substrate 32, without thermally isolating interconnect 50 from substrate 32.

In variations on the FIG. 2 chip in which substrate 32 is N-type semiconductor material, region 33 would be doped to have P-type polarity (opposite to that of substrate 32). In other variations on the FIG. 2 chip, the step of forming a PN junction to electrically isolate interconnect 50 from substrate 32 is omitted (so that the inventive metal interconnect is electrically and thermally coupled with substrate 32).

Figure 3:
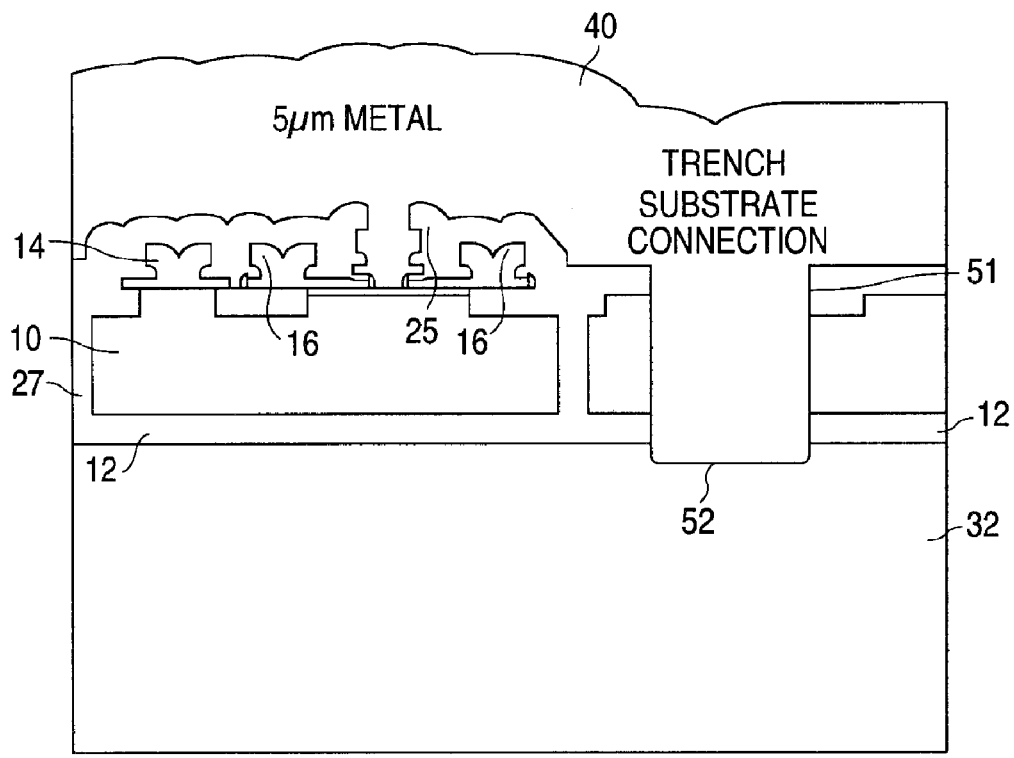
FIG. 3 is a cross-sectional view of a portion of an integrated circuit that embodies the invention and includes an NPN bipolar transistor formed over oxide layer 12 with a relatively thick metal interconnect (40) providing a heat flow path between the transistor's emitter and a semiconductor substrate (32) underlying oxide 12.

FIG. 3 is a cross-sectional view of a portion of an integrated circuit that embodies the invention and differs from the FIG. 2 chip only in that it includes a thicker metal interconnect 40 (which provides a heat flow path between substrate 32 and the NPN bipolar transistor's emitter) in place of interconnect 50, and does not include a PN junction below bottom surface 52 of trench 51 to electrically isolate interconnect 40 from substrate 32. The elements of FIG. 3 that are identical to corresponding elements of FIG. 2 are numbered identically in these two figures and the description thereof will not be repeated with reference to FIG. 3.

To manufacture the FIG. 3 chip, mask and process etch steps are performed to extend trench 51 through region 30 and oxide layer 12 into the underlying substrate 32. Metal interconnects, including metal interconnects that extend out of the plane of FIG. 3 to couple each of terminals 14 and 16 to at least one other element of the chip, are formed by an interconnect-forming process. Each of the interconnects has the same thickness (above region 10) as does each of terminals 14 and 16. Oxide regions 25 and 27 are then formed over the interconnects (and other exposed structures) to electrically isolate collector terminal 14, base terminal 16, and the emitter terminal of the NPN transistor from each other and other circuit elements. A metal interconnect deposition step (preferably of the same type performed to produce other metal interconnects of the chip) is then performed to deposit the metal comprising interconnect 40 over the NPN transistor's emitter and oxide regions 25 and 27, and to completely fill trench 51 with metal. In typical implementations, the thickness of metal interconnect 40 (above oxide region 25) is about 5 microns. Alternatively, the metal that fills trench 51 and provides the inventive metal heat flow path to substrate 32 can be deposited as a "bump" having thickness greater than that of other metal interconnects of the circuit.

In the FIG. 3 circuit, metal interconnect 40 provides a heat flow path between the NPN transistor's emitter and substrate 32. In variations on the FIG. 3 chip, a volume of substrate material below bottom surface 52 of trench 51 is doped to have polarity opposite to the rest of substrate 32, thereby forming a PN junction to isolate interconnect 40 electrically (but not thermally) from substrate 32.

Figure 4:
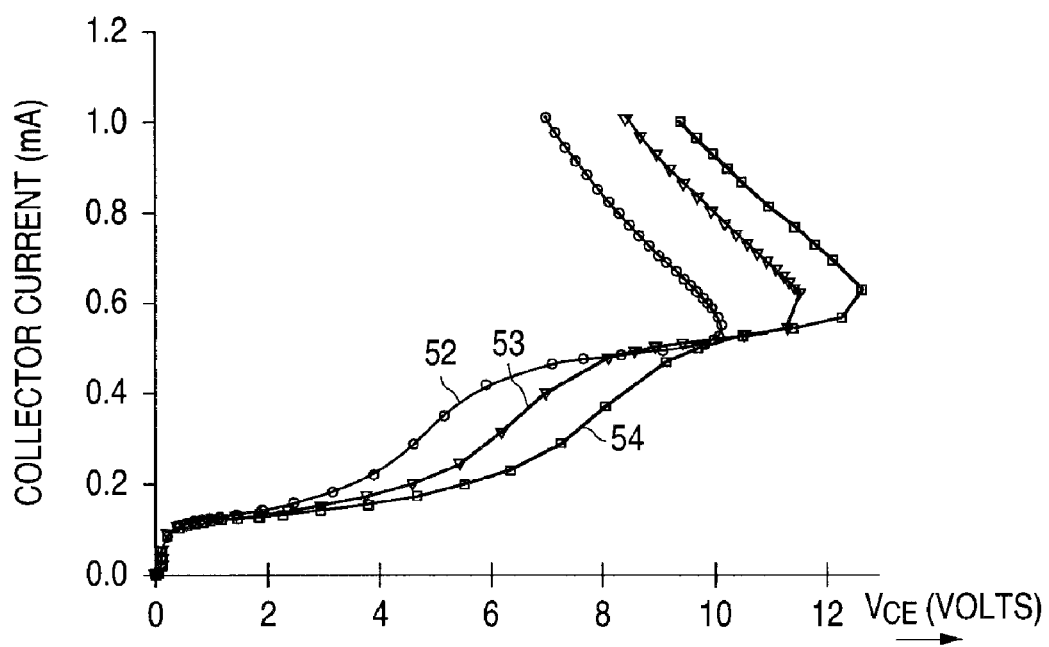
FIG. 4 is a graph of current-voltage characteristics of the bipolar transistors of FIGS. 1, 2, and 3.

FIG. 4 is a graph of current-voltage characteristics of the NPN bipolar transistors of FIGS. 1, 2, and 3. Curve 52 is a plot of the collector current (in milliamps) of the NPN transistor of FIG. 1 as a function of voltage between collector 14 and emitter 18. Curve 53 is a plot of the collector current (in milliamps) of the NPN transistor of FIG. 2 as a function of voltage between the transistor's collector 14 and emitter. Curve 54 is a plot of the collector current (in milliamps) of the NPN transistor of FIG. 3 as a function of voltage between the transistor's collector 14 and emitter. Each of curves 52, 53, and 54 assumes a base current of on the order of 0.1 mA.

Figure 5:
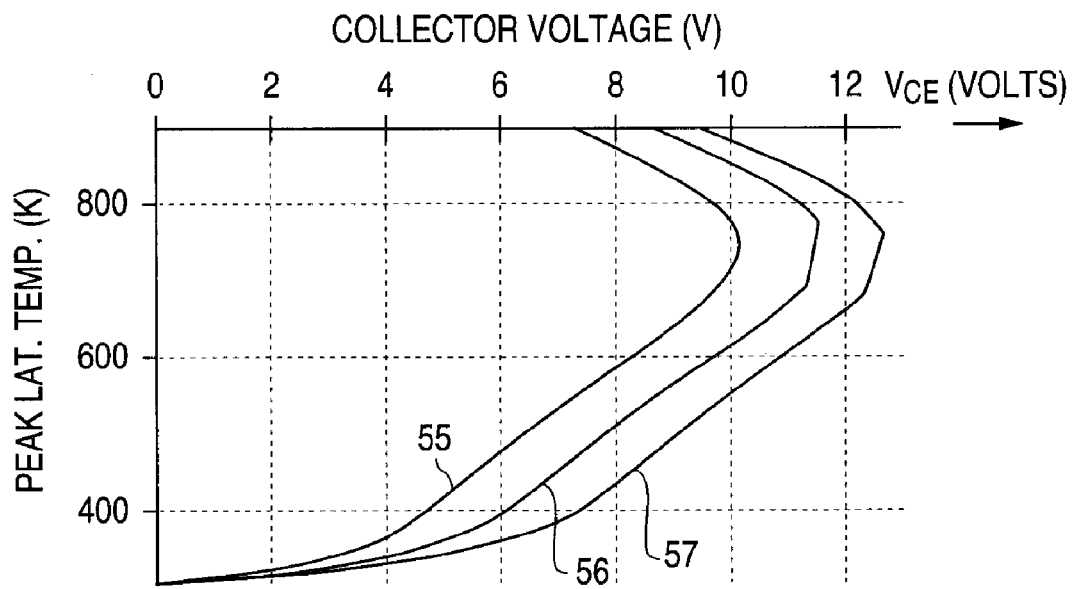
FIG. 5 is a graph of peak temperatures of the bipolar transistors of FIGS. 1, 2, and 3, as a function of voltage between the collector and emitter of each.

FIG. 5 is a graph of peak temperatures of the NPN bipolar transistors of FIGS. 1, 2, and 3, as a function of voltage between the collector and emitter of each. Curve 55 is a plot of the peak lattice temperature (in degrees Kelvin) of the NPN transistor of FIG. 1 as a function of voltage between collector 14 and emitter 18. Curve 56 is a plot of the peak lattice temperature (in degrees Kelvin) of the NPN transistor of FIG. 2 as a function of voltage between the transistor's collector 14 and emitter. Curve 57 is a plot of the peak lattice temperature (in degrees Kelvin) of the NPN transistor of FIG. 3 as a function of voltage between the transistor's collector 14 and emitter. Each of curves 55, 56, and 57 assumes a base current of on the order of 0.1 mA. It is apparent from FIG. 5 that modification of the NPN transistor of FIG. 1 in accordance with the invention to include a relatively thin metal interconnect (i.e., interconnect 50 of FIG. 2) is effective to reduce the transistor's peak temperature (relative to the reference temperature indicated by curve 55) over a wide range of collector-emitter voltages. It is also apparent from FIG. 5 that modification of the NPN transistor of FIG. 1 in accordance with the invention to include a relatively thick metal interconnect (i.e., interconnect 54 of FIG. 3) is even more effective to reduce the transistor's peak temperature (relative to the reference temperature indicated by curve 55) over a wide range of collector-emitter voltages.

Figure 6:
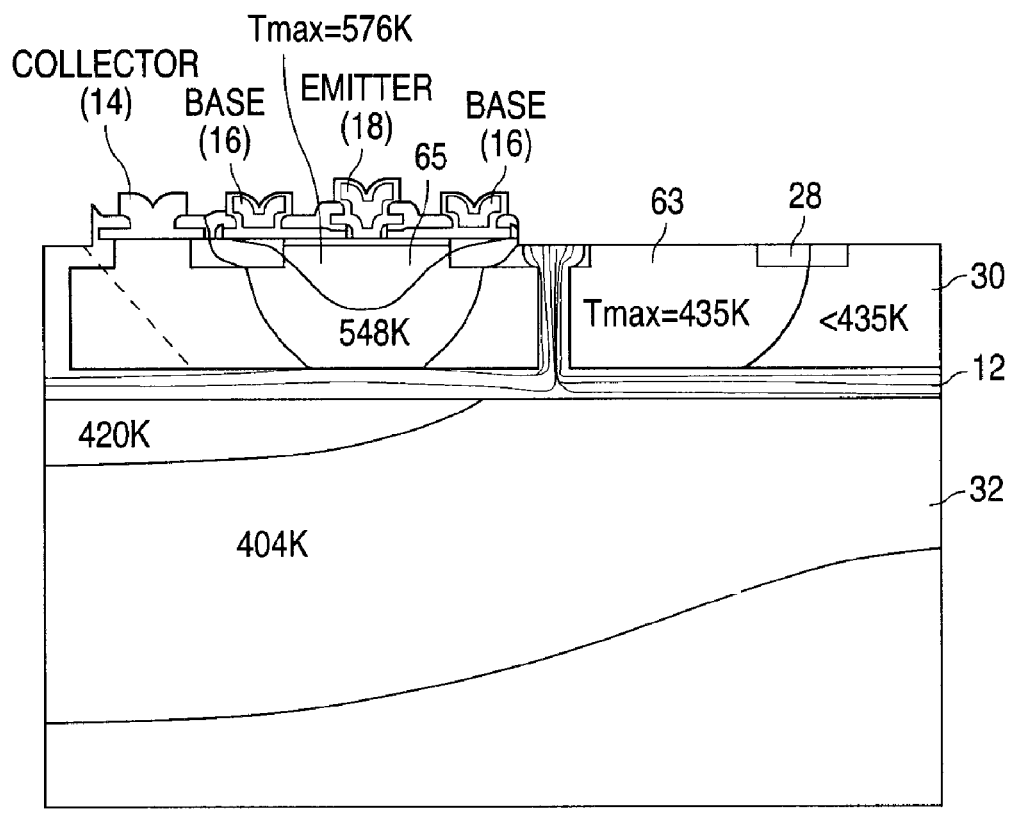
FIG. 6 is a plot of temperature as a function of position within the integrated circuit of FIG. 1, assuming a base current of 0.1 mA and a collector current of 5 mA for the NPN bipolar transistor.

FIG. 6 is a plot of temperature as a function of position within the integrated circuit of FIG. 1, assuming a base current of 0.1 mA and a collector current of 5 mA (i.e., a voltage of about 7.7 volts between collector 14 and emitter 18) of the NPN bipolar transistor thereof. As apparent from FIG. 6, the temperature difference between the transistor's hottest region (region 65, under emitter 18) and the hottest region (region 63) of body 30 of the adjacent device is about 141 degrees Kelvin.

Figure 7:
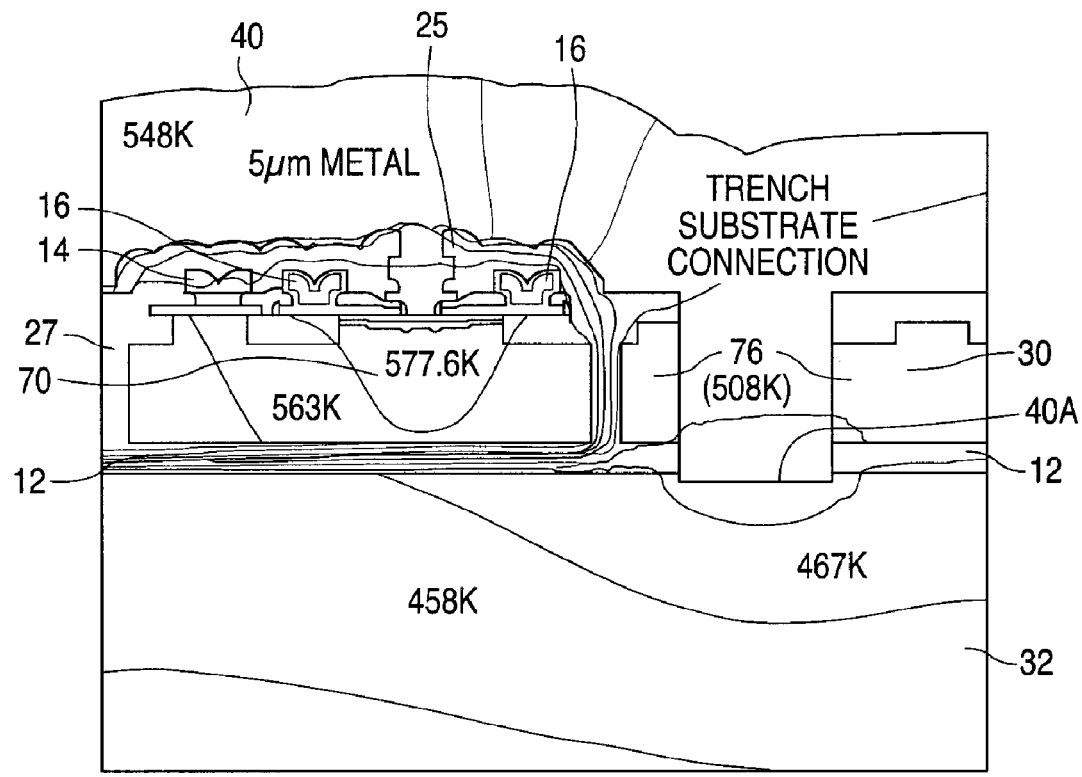
FIG. 7 is a plot of temperature as a function of position within the integrated circuit of FIG. 3, assuming a base current of 0.1 mA and a collector current of 5 mA for the NPN bipolar transistor.

FIG. 7 is a plot of temperature as a function of position within the integrated circuit of FIG. 3, assuming a base current of 0.1 mA and a collector current of 5 mA (i.e., a voltage of about 10.5 volts between collector 14 and the emitter) of the NPN bipolar transistor thereof. As apparent from FIG. 7, the temperature difference between the hottest region (region 70, under the emitter) of the NPN transistor of FIG. 3, and the hottest regions (regions 76) of body 30 of the adjacent device, is only about 70 degrees Kelvin (about half the temperature difference indicated in FIG. 6 between the hottest region of the NPN transistor of FIG. 1 and the hottest region of the body of the device adjacent thereto).

Figure 8:
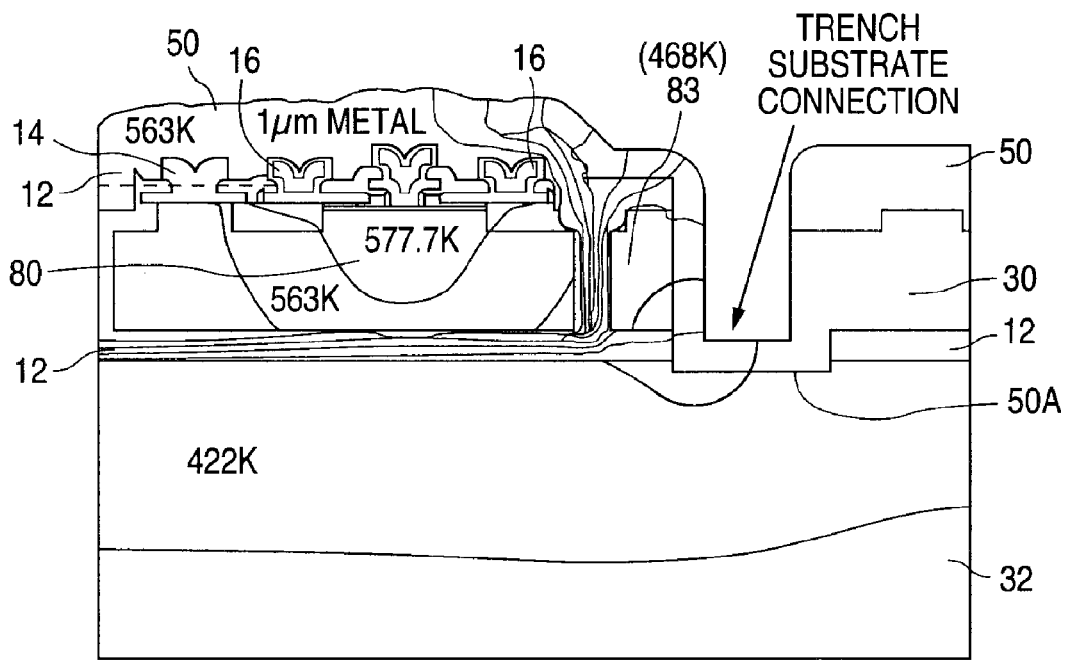
FIG. 8 is a plot of temperature as a function of position within the integrated circuit of FIG. 2, assuming a base current of 0.1 mA and a collector current of 5 mA for the NPN bipolar transistor.

FIG. 8 is a plot of temperature as a function of position within the integrated circuit of FIG. 2, assuming a base current of 0.1 mA and a collector current of 5 mA (i.e., a voltage of about 9 volts between collector 14 and the emitter) of the NPN bipolar transistor thereof. As apparent from FIG. 8, the temperature difference between the hottest region (region 80, under the emitter) of the NPN transistor of FIG. 2, and the hottest region (region 83) of body 30 of the adjacent device, is only about 110 degrees Kelvin (substantially less than the temperature difference indicated in FIG. 6 between the hottest region of the NPN transistor of FIG. 1 and the hottest region of the body of the device adjacent thereto).

Figure 9:
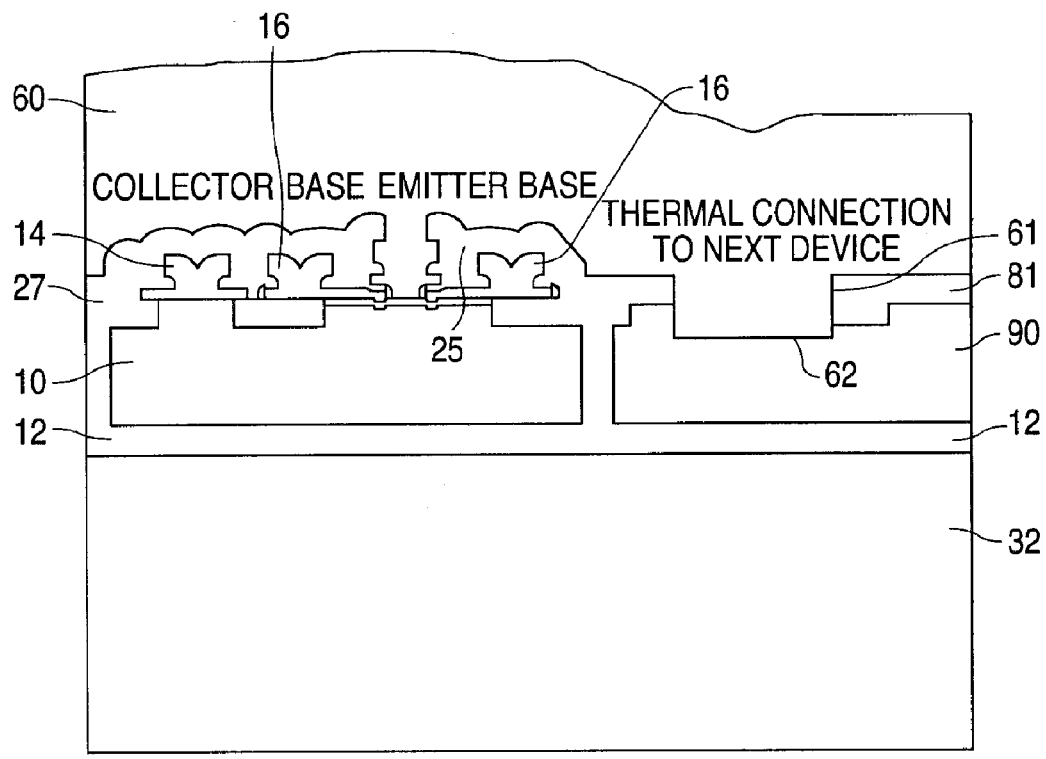
FIG. 9 is a cross-sectional view of a portion of an integrated circuit that embodies the invention and differs from the chip of FIG. 3 in that a metal heat flow path (interconnect 60) extends from the NPN bipolar transistor's emitter only to the body of an adjacent semiconductor device; not to substrate 32 underlying oxide 12 (as does metal interconnect 40 of FIG. 3).

FIG. 9 is a cross-sectional view of a portion of an integrated circuit that embodies the invention and differs from the chip of FIG. 3 in that that a metal heat flow path (interconnect 60) extends from the NPN bipolar transistor's emitter only to the body of an adjacent semiconductor device; not to substrate 32 underlying oxide 12 (as does metal interconnect 40 of FIG. 3). The elements of FIG. 9 that are identical to corresponding elements of FIG. 3 are numbered identically in these two figures and the description thereof will not be repeated with reference to FIG. 9.

In FIG. 9, the body of the device on the right (adjacent to the NPN transistor on the left) is semiconductor region 90 (above oxide layer 12). Oxide layer 81 overlies part of region 90. To manufacture the FIG. 9 chip, mask and process etch steps are performed to extend trench 61 into region 90 but not through oxide layer 12 into the underlying substrate 32. Oxide regions 25 and 27 are formed to electrically isolate collector terminal 14, base terminal 16, and the emitter terminal of the NPN transistor from each other and other circuit elements. A metal interconnect deposition step (preferably of the same type performed to produce other metal interconnects of the chip) is then performed to deposit the metal comprising interconnect 60 over the NPN transistor's emitter and oxide regions 25 and 27, and to completely fill trench 51 with metal. In typical implementations, the thickness of metal interconnect 60 (above oxide region 25) is about 5 microns. Alternatively, the metal that fills trench 61 and provides the inventive metal heat flow path to region 90 can be deposited as a "bump" having thickness greater than that of other metal interconnects of the circuit.

In the FIG. 9 circuit, metal interconnect 60 provides a heat flow path between the NPN transistor's emitter and the body (region 90) of the adjacent device. In variations on the FIG. 3 chip, a volume of region 90 below bottom surface 62 of trench 61 is doped to have polarity opposite to the underlying portion of region 90, thereby forming a PN junction to isolate interconnect 60 electrically (but not thermally) from the portion of region 90 underlying the PN junction.

Figure 10:
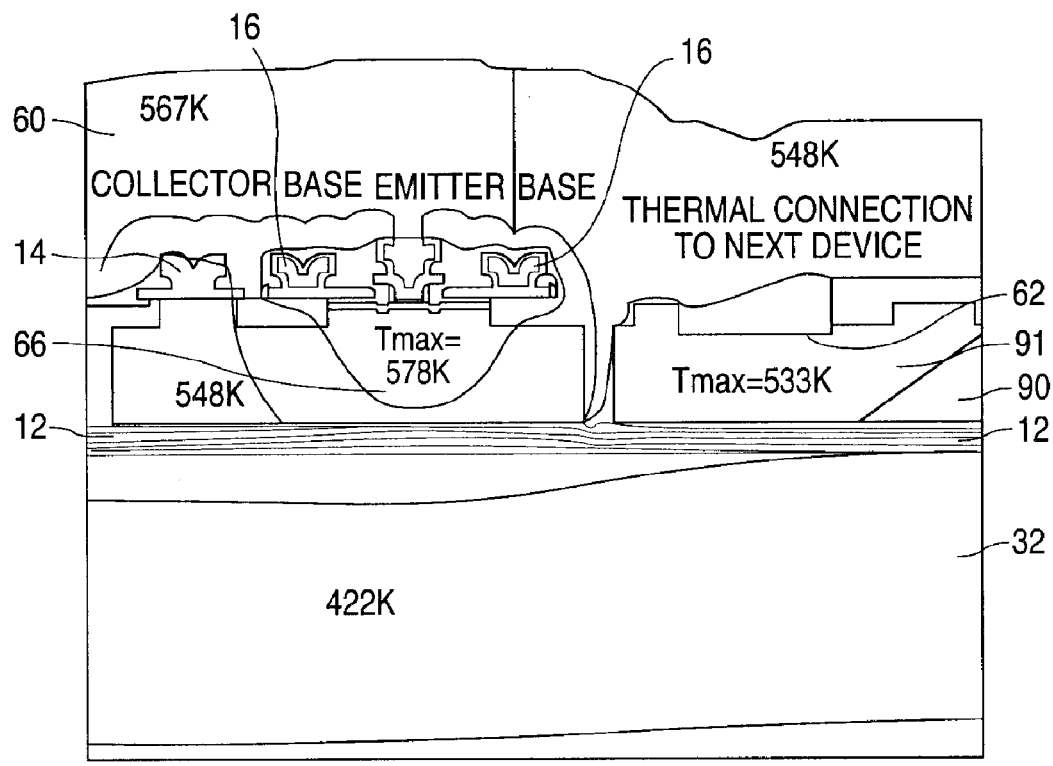
FIG. 10 is a plot of temperature as a function of position within the integrated circuit of FIG. 9, assuming a base current of 0.1 mA and a collector current of 5 mA for the NPN bipolar transistor.

FIG. 10 is a plot of temperature as a function of position within the integrated circuit of FIG. 9, assuming that the NPN bipolar transistor thereof is operating with a base current of 0.1 mA and a collector current of 5 mA. As apparent from FIG. 10, the temperature difference between the hottest region (region 66, under the emitter) of the NPN transistor of FIG. 9, and the hottest region (region 91) of the body of the adjacent device (region 90), is only 35 degrees Kelvin (much less than the temperature difference indicated in FIG. 6 between the hottest region of the NPN transistor of FIG. 1 and the hottest region of the body of the device adjacent thereto).

Figure 11:
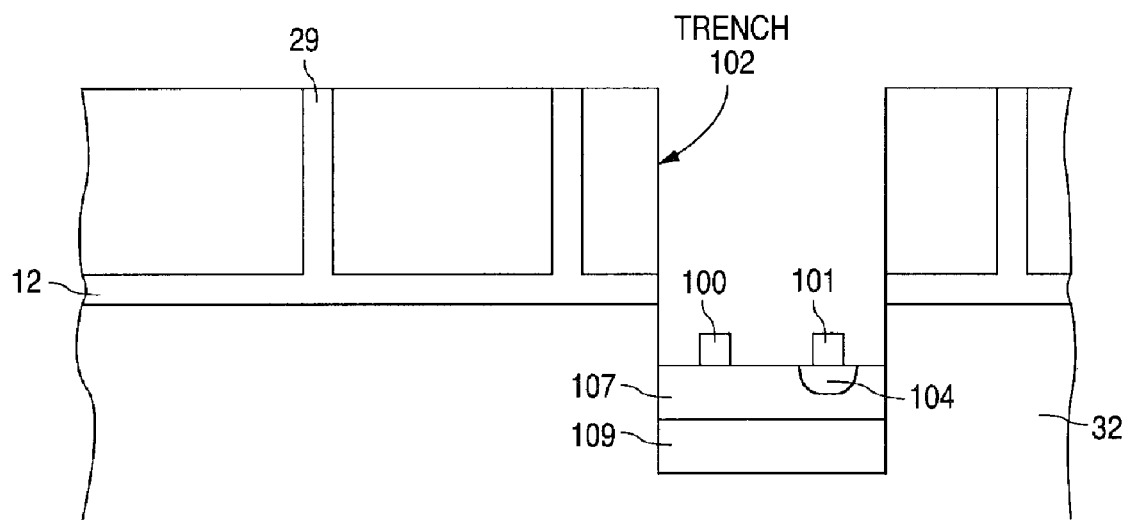
FIG. 11 is a simplified cross-sectional view of another portion of the integrated circuit of FIG. 2, showing a substrate device formed near the bottom of a second trench (102) extending from the top surface of the chip through oxide layer 12 into substrate 32.

In a class of embodiments, the invention is an integrated circuit including at least one transistor having a metal heat flow path extending between a terminal of the transistor and a semiconductor substrate over which the transistor is formed. The metal heat flow path includes metal that fills (completely or partially) a trench (e.g., trench 51 of FIG. 2) that extends from a top surface of the chip to the substrate. The chip also includes at least one other semiconductor device (sometimes referred to herein as a "substrate device") formed at (e.g., near) the bottom of a second trench extending from the top surface of the chip to the substrate. The integrated circuit of FIG. 2 is an example of an embodiment in this class. FIG. 11 is a simplified cross-sectional view of another portion (not shown in FIG. 2) of the FIG. 2 chip.

In FIG. 11, a substrate device (comprising terminals 100 and 101, doped silicon region 104, and body 107) formed near the bottom of trench 102, which extends from the top surface of the chip through oxide layer 12 into substrate 32. In the embodiment of FIGS. 2 and 11 (and other embodiments including substrate devices), each trench filled at least partially with metal providing a metal heat flow path (in accordance with the invention), and each trench in which a substrate device is formed, are manufactured using the same process step or steps, to simplify the overall process of manufacturing the chip.

The substrate device of FIG. 11 can be implemented to function as a Zener diode. Alternatively, one or more other devices (e.g., simple devices) could be formed as substrate devices at or near the bottom of trench 102. To implement the substrate device of FIG. 11, epitaxial layers (epi layers) 107 and 109 are formed on substrate 32 at the bottom of trench 102 and the substrate device is device is formed in (and on) epi layer 107.

Figure 12:
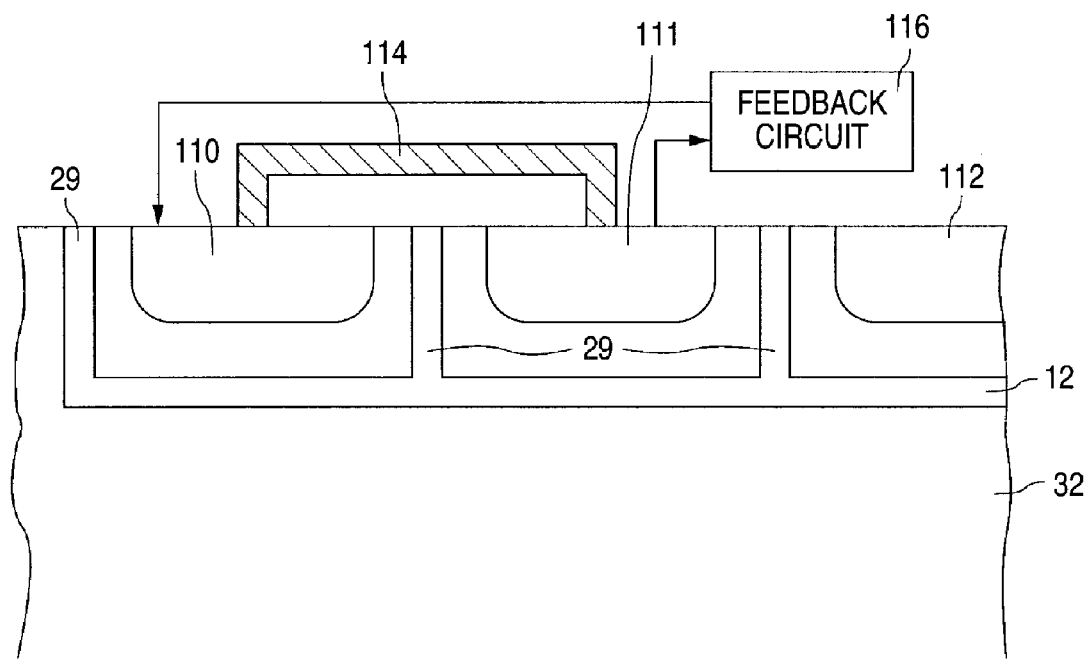
FIG. 12 is a simplified cross-sectional view of a portion of an integrated circuit that embodies the invention. The chip of FIG. 12 includes transistors, and a feedback control loop coupled to one of the transistors and configured to sense the temperature of each of said one the transistors and to control at least one operating parameter of said one of the transistors in response to the sensed temperature.

In another class of embodiments, the invention is an integrated circuit including transistors and a feedback control loop coupled to at least one of the transistors and configured to sense the temperature of said one of the transistors and to control at least one operating parameter (e.g., a bias voltage) of said one of the transistors in response to the sensed temperature. FIG. 12 is a simplified cross-sectional view of a portion of one such integrated circuit. The FIG. 12 chip is an SOI integrated circuit.

To manufacture the FIG. 12 chip, oxide layer 12 is formed on P-type silicon substrate 32 and a top layer of silicon is bonded to oxide layer 12. Additional processing steps are then performed to form a circuit, including transistors 110 and 112 and temperature sensing device 111, in the top layer of silicon. Oxide regions 29 are formed to electrically isolate devices in the top layer of silicon from each other. A feedback control loop coupled to transistor 110 is configured to sense the temperature of transistor 110 and to control at least one operating parameter of transistor 110 in response to the sensed temperature. Specifically, the feedback control loop includes metal interconnect 114 (coupled between transistor 110 and device 111) and feedback and control circuit 116 (coupled between device 111 and transistor 110). Circuit 116 can be implemented in a region (not shown) of the FIG. 12 chip. Device 111 and circuit 116 can implement a band gap temperature sensing circuit.

Circuit 116 controls at least one operating parameter (e.g., a bias voltage) of transistor 110 in response to feedback from device 111 indicative of the temperature of transistor 110 (and optionally also in response to temperature feedback from other transistors of the chip) to implement temperature stabilization. For example, the temperature feedback can avoid problems that would otherwise result from unequal operating temperatures of various SOI devices of the chip (including transistor 110). More specifically, if transistor 110 is determined to have a temperature that is too high relative to that of another SOI device of the chip, circuit 116 could assert a control signal to cause a decrease in the operating temperature of transistor 110.

In some applications, implementation of a chip with one or more of the inventive feedback control loops (e.g., the loop described with reference to FIG. 12) can eliminate the need for the chip to include any metal heat flow path between a terminal of a transistor thereof and bulk semiconductor material of the chip. Alternatively, in some embodiments of the invention, a chip is implemented with at least one such feedback control loop (e.g., a loop of the type described with reference to FIG. 12) and at least one metal heat flow path (preferably implemented by the same process step or steps used to implement other metal interconnects of the chip) between a terminal of a transistor of the chip and bulk semiconductor material of the chip.

Figure 13:
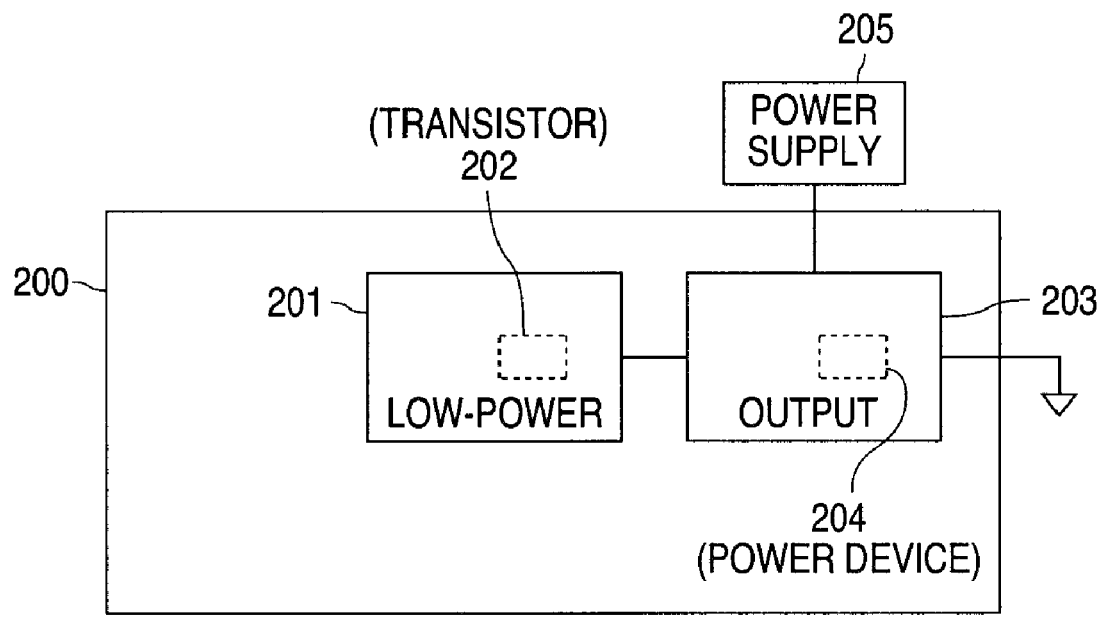
FIG. 13 is a block diagram of an integrated circuit that embodies the invention, showing some elements and devices of the integrated circuit.

Another class of embodiments of the inventive chip will be described with reference to FIG. 13. Integrated circuit 200 of FIG. 13 is an SOI chip including low-power circuitry 201 and output circuitry 203, connected as shown. Output circuitry 203 includes at least one power transistor (e.g., power transistor 204) coupled between a power supply bus (maintained by power supply 205 at high potential above ground) and ground. At least one (and typically all) power transistor of output circuitry 203 is implemented in accordance with the invention to include a metal heat flow path between a terminal thereof (e.g., a power device terminal directly connected to ground or to the power supply bus) and bulk semiconductor material of chip 200. Low-power circuitry 201 includes at least one transistor (transistor 202) and typically includes many transistors. No transistor of low-power circuitry 201 has a terminal coupled (by a metal heat flow path) to bulk semiconductor material of chip 200 in accordance with the invention. Low-power circuitry 201 thus benefits from all the substrate isolation advantages provided by SOI technology while each metal heat flow path (to a bulk semiconductor heat sink) in output circuitry 203 provides heat balancing benefits in accordance with the invention.

Figure 14:
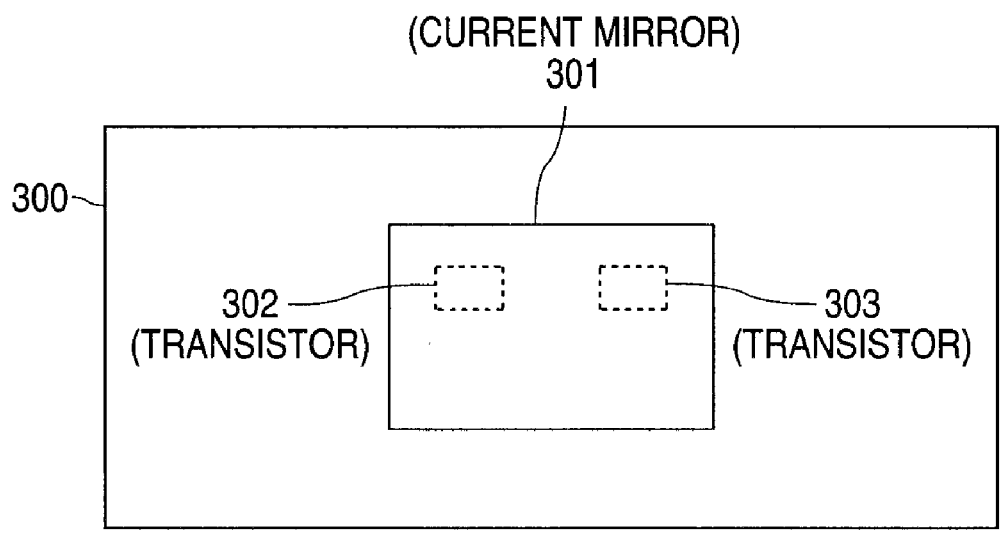
FIG. 14 is a block diagram of an integrated circuit that embodies the invention, showing some elements and devices of the integrated circuit.

Another class of embodiments of the inventive chip will be described with reference to FIG. 14. Integrated circuit 300 of FIG. 14 is an SOI chip including current mirror 301 and other circuitry (not shown). Current mirror 301 includes transistors 302 and 303, each formed over an insulating layer. The insulating layer overlies a semiconductor substrate. In accordance with the invention, a metal heat flow path extends from a terminal of transistor 302 to the semiconductor substrate (or to bulk semiconductor material of another device of current mirror 301) and another metal heat flow path extends from a terminal of transistor 303 to the semiconductor substrate (or to bulk semiconductor material of another device of current mirror 301). For example, a metal heat flow path could extend from a terminal of transistor 302 to bulk semiconductor material of another device of current mirror 301, and another metal heat flow path could extend from a terminal of transistor 303 to the same volume of bulk semiconductor material. The heat flow paths provide a thermal connection between transistors 302 and 303 to ensure that the transistors' operating conditions are more similar than they would be if each heat flow path were omitted from the FIG. 14 chip.

It should be understood that various alternatives to the embodiments of the invention described herein may be employed in practicing the invention. It is intended that the following claims define the scope of the invention and that structures within the scope of these claims and their equivalents be covered thereby.

What is claimed is:

1. A method for manufacturing an integrated circuit including bulk semiconductor material, wherein the integrated circuit is an SOI integrated circuit having a semiconductor substrate, and the substrate includes the bulk semiconductor material, said method including the steps of:
   (a) forming at least one transistor at a location separate from the bulk semiconductor material;
   (b) forming a metal heat flow path between a terminal of the transistor and the bulk semiconductor material; and
   (c) forming an insulating layer over the substrate, wherein step (a) includes the step of forming circuitry over the insulating layer, said circuitry including the transistor, and step (b) includes the step of forming the metal heat flow path so that said metal heat flow path extends from the terminal of the transistor through the insulating layer into the substrate, including by producing a trench that extends from a top surface of the integrated circuit through the insulating layer into the substrate, and filling the trench at least partially with metal during formation of the metal heat flow path, said method also including the steps of:
   producing a second trench that extends from the top surface of the integrated circuit through the insulating layer into the substrate; and
   forming at least one semiconductor device at the bottom of the second trench.

\* \* \* \* \*